United States Patent [19]

Watanabe et al.

[11] Patent Number: 5,056,929
[45] Date of Patent: Oct. 15, 1991

[54] TEMPERATURE COMPENSATION TYPE INFRARED SENSOR

[75] Inventors: Sigeru Watanabe, Tokorozawa; Kenji Kamiya, Iruma; Takanori Nanya, Sayama, all of Japan

[73] Assignee: Citizen Watch Co., Ltd., Tokyo, Japan

[21] Appl. No.: 648,134

[22] Filed: Jan. 30, 1991

[30] Foreign Application Priority Data

| | | |
|---|---|---|
| Jan. 30, 1990 [JP] | Japan | 2-7111[U] |
| Feb. 20, 1990 [JP] | Japan | 2-15263[U] |
| Mar. 27, 1990 [JP] | Japan | 2-30479[U] |
| Sep. 28, 1990 [JP] | Japan | 2-101864[U] |

[51] Int. Cl.$^5$ ............................ G01K 7/02; G01K 7/10
[52] U.S. Cl. ...................................... 374/181; 136/230; 136/213; 338/22 R; 374/129
[58] Field of Search ................ 374/181, 182, 129; 136/230; 338/22 R

[56] References Cited

U.S. PATENT DOCUMENTS

| | | | |
|---|---|---|---|
| 4,456,919 | 6/1984 | Tomita et al. | 374/178 X |
| 4,472,594 | 9/1984 | Ishida | 374/179 |
| 4,488,824 | 12/1984 | Salem | 374/181 |
| 4,624,582 | 11/1986 | Banda et al. | 374/181 |
| 4,722,612 | 2/1988 | Junkert et al. | 136/230 X |
| 4,772,790 | 9/1988 | Aldridge | 250/343 |
| 4,804,272 | 2/1989 | Schmitz | 374/181 |

*Primary Examiner*—Daniel M. Yasich
*Attorney, Agent, or Firm*—Rogers, Howell & Haferkamp

[57] ABSTRACT

A temperature compensation type infrared sensor includes a substrate having a central pit and functioning as a heat sink with an insulation film formed on the top face of the substrate and defining a diaphragm located above the pit, a plurality of thermocouples disposed on the insulation film and connected in series with each of said thermocouples having a hot junction on said diaphragm and a cold junction on the heat sink, and a thermopile element including a black body on the central portion of the diaphragm in the insulation film for absorbing infrared rays with the thermopile element being placed on a thermistor chip for compensating temperature.

16 Claims, 4 Drawing Sheets

TEMPERATURE COMPENSATION TYPE INFRARED SENSOR

BACKGROUND OF THE INVENTION

1. Field of the Invention

The present invention relates to the structure of an infrared sensor employing thermopile or other elements.

2. Description of the Prior Art

There are known various structures of non-contact type infrared sensors which utilize thermopile elements, thermistors or current collector elements. An infrared sensor utilizing a diaphragm-like thermopile element, which will be called "thermopile type infrared sensor", is disclosed, for example, in U.S. Pat. No. 4,111,717. The basic structure of a thermopile element used in the thermopile type infrared sensor is shown in FIGS. 1 and 2 of the accompanying drawings. FIG. 1 is a cross-sectional view of the thermopile element of the thermopile type infrared sensor while FIG. 2 is a plan view of the primary part of the thermopile element.

Referring to FIG. 1, the thermopile element comprises a silicon chip 10, one side of which is treated and coated with an insulation film 11. The central portion of the silicon chip 10 is then etched to form a pit 12. The remaining part of the insulation film 11 within the pit 12 will defines a diaphragm 13. The insulation film 11 may be of a single layer of silicon oxide ($SiO_2$) or three-layer film consisting of a silicon nitride ($SiN_2$), a silicon oxide ($SiO_2$) and a silicon nitride ($SiN_2$).

A number of thermocouples 14 are disposed on the insulation film 11 and electrically connected in series with each other. Each of the thermocouples 14 includes a hot junction 14a placed on the diaphragm 13 and a cold junction 14b positioned on a heat sink 11a which is defined by the remaining part of the silicon chip 10 placed around the outer periphery of the diaphragm 13 and having a larger heat capacity.

The central portion of the diaphragm 13 carries a black body 15 for absorbing infrared rays. Generally, the black body 15 may be formed by ultrafine gold particles deposited over the diaphragm 13 and which look black since these gold particles absorb visible rays and infrared rays without reflection. Since the gold is an electric conductor, the black body 15 must be reliably separated away from the hot junctions 14a of the thermocouples 14 without any short-circuiting.

As the black body 15 of such an infrared sensor absorbs infrared rays from an object to be measured, temperature rises in the diaphragm 13 at the hot junctions 14a of the thermocouples 14. Thus, a difference in temperature between the hot and cold junctions in each of the thermocouples 14 will create a voltage output. Since the amount of infrared ray is interrelated with the temperature of the object, the thermopile element will serve as a non-contact type thermometer. On conversion of temperature, however, the temperature at each of the cold junctions of the thermocouples 14 must be accurately measured at all times since this temperature is used as a reference level.

One of simple methods for measuring the temperature at the cold thermocouple junction is that a thermistor is mounted on the outside of a package on which the thermocouples 14 are mounted. In such a case, however, the thermistor is not in direct contact with the cold junction of each of the thermocouples. There is thus created a temperature gradient which will prevent the temperature at the cold junction from being accurately monitored.

In order to overcome such a problem, it has been considered that the thermistor is housed within the package in proximity to the cold junction. The thermistor is miniaturized or formed into a film and mounted on the heat sink 11a on which the cold junction is formed. However, the heat sink 11a has only a very small space which is utilized to mount the thermistor. Therefore, the size of the thermistor should be reduced into about 1/10 times the size of the pile element 1. Since the pile element 1 itself is at most of two millimeter square, the reduction of size in the thermistor is very difficult, involved with less reliability.

On the other hand, such a thermopile type infrared sensor requires a diaphragm 13 of a material having a heat conductivity as small as possible to take a differential temperature between the hot and cold junctions 14a and 14b of a thermocouple 14 more easily. When the diaphragm 13 having less heat conductivity is used, heat emitted from the object to be measured and absorbed by the black body 15 will not transmit to the hot junction 14a very well. This results in reduction of sensitivity.

As shown in detail in FIG. 2, each of the thermocouples 14 comprises a pair of first and second conductors 141 and 142 which are made of different metallic materials and connected in series with each other. The hot junction 14a of the thermocouple 14 is disposed on the diaphragm 13 while the cold junction 14b thereof is located outside of the diaphragm 13, that is, on the heat sink 11a. The central portion of the diaphragm 13 carries an electrically conductive black body 15 which is separated apart from the hot junction 14a of each of the thermocouples 14 normally several tens microns for providing an electrical insulation. Energy of the infrared rays absorbed by the black body 15 will be consumed to increase the temperature of the diaphragm 13 itself as it moves to the hot junction 14a of the thermocouple 14 via the diaphragm 13. As a result, the temperature of the hot junction 14a cannot be increased to a desired level which provides a desired output voltage. In order to overcome such a problem, it has been proposed that the number of thermocouples is increased to increase the output voltage. However, such a proposal leads to increase of cumbersome steps and still provides less reliability. It has been also made such a proposal that the black body is made of an insulation material. However, such a technique does not reach a level that its characteristic is acceptable.

SUMMARY OF THE INVENTION

It is therefore a primary object of the present invention to provide an infrared sensor utilizing thermocouple elements, which can accurately measure the temperature at the cold junctions of the thermocouple elements and which can be manufactured more easily and simply.

The second object of the present invention is to provide a thermopile type infrared sensor which is improved in sensitivity.

The third object is to provide an infrared sensor which provides less energy loss in heat conduction between the electrically conductive black body and the hot junction of the thermocouple and which can attain substantially the same temperature of the hot junction as that of the black body.

The fourth object is to provide an infrared sensor which can reduce energy loss in the black body and which can increase the temperature of the hot junction more efficiently.

To attain the first object of the present invention, the present invention provides an infrared sensor which comprises a diaphragm-like thermopile element disposed on a thermistor chip for compensating the temperature.

To attain the second object, the present invention provides an infrared sensor which comprises a black body for absorbing infrared rays and thermocouples, the black body being thermally joined with the hot junctions of the thermocouples through a hard carbon film which is an insulator having a large heat conductivity.

To attain the third object, the present invention provides an infrared sensor in which an electrically conductive black body is formed into such a pattern that the black body is in contact with the hot junctions of the thermocouples and that the adjacent hot junctions are electrically separated from each other.

To attain the fourth object, the present invention provides an infrared sensor of a decompression sealed structure in which at least the detector section is maintained at negative pressure.

BRIEF DESCRIPTION OF THE ACCOMPANYING DRAWINGS

DETAILED DESCRIPTION OF PREFERRED EMBODIMENTS

The present invention will now be described with reference to the drawings.

Figure 1:
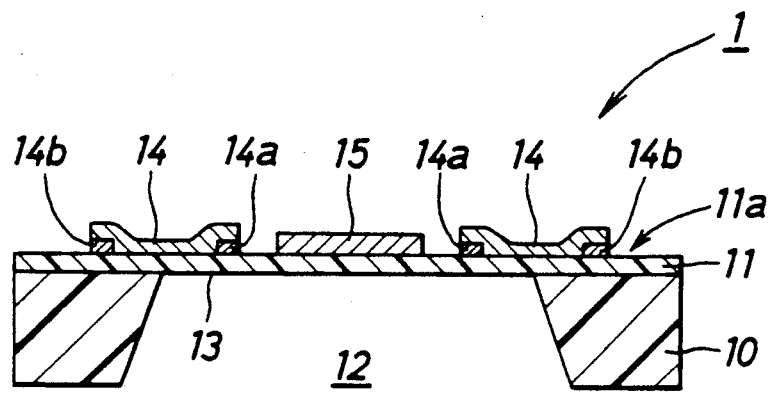
FIG. 1 is a cross-sectional view of a thermopile element in a prior art thermopile type infrared sensor, taken along a line A—A in FIG. 2.
Figure 2:
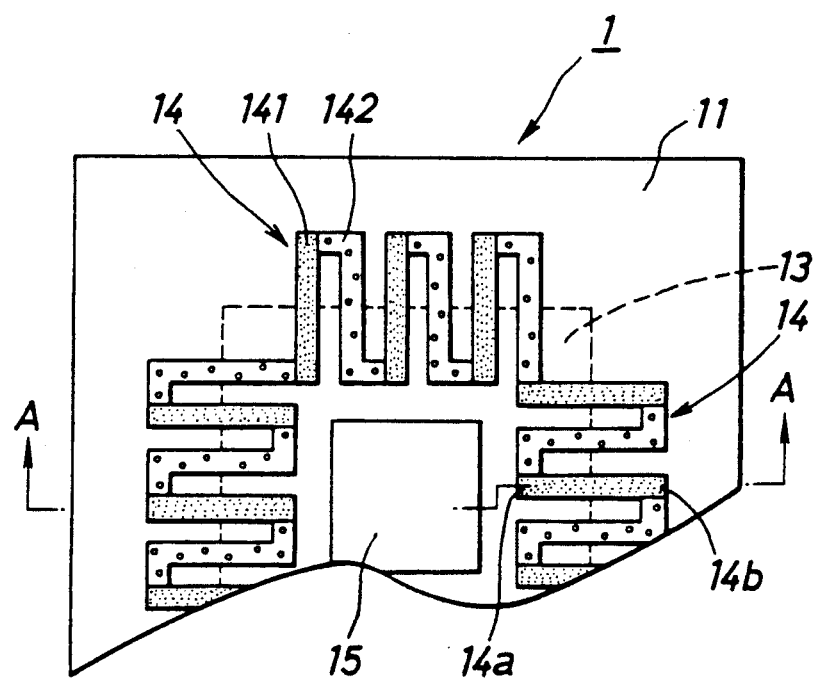
FIG. 2 is a plan view of the primary part of the thermopile element shown in FIG. 1.
Figure 3:
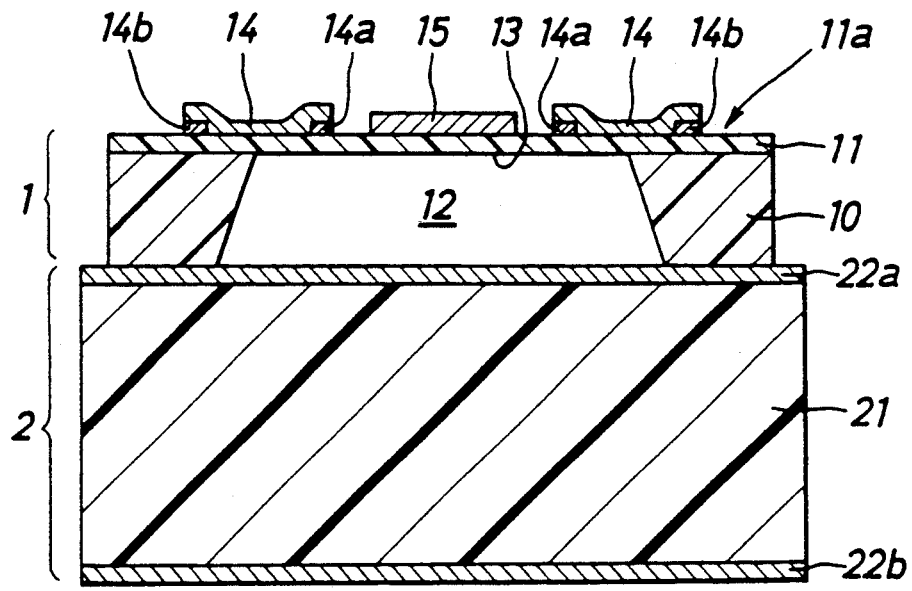
FIG. 3 is a diagrammatically cross-sectional view of one embodiment of a temperature compensation type infrared sensor constructed in accordance with the present invention.

Referring to FIG. 3, there is shown a diagrammatically cross-sectional view of one embodiment of a temperature compensation type infrared sensor constructed in accordance with the present invention, in which reference numerals similar to those of FIGS. 1 and 2 designate similar parts.

The infrared sensor comprises a thermopile element 1 and a thermistor 2. The thermopile element 1 includes a substrate 10 formed from a material of good heat conductivity, such as silicon chip and also serving as a heat sink 11a and an insulation film 11 formed thereon. The central portion of the thermopile element 1 is of a diaphragm-like structure. The thermopile element 1 further includes a pit 12 formed therein to provide a diaphragm 13 and a plurality of thermocouples 14 disposed on the diaphragm 13 with the hot junction 14a of each of the thermocouples 14 being disposed on the diaphragm 13. The cold junction 14b of each of the thermocouples 14 is located on the substrate 10. The central portion of the diaphragm 13 carries a black body 15 for absorbing infrared rays.

The size of the thermistor 2 is slightly larger than that of the thermopile element 1 and may be of bulk type which is commercially available and which has a resistance chip 21 of metal oxide or the like and electrodes 22a, 22b on the opposite sides of the resistance chip 21. The thermopile element 1 is integrally joined with the thermistor 2 such that the back face of the substrate 10 in the thermopile element 1 is in intimate contact with the upper electrode 22a of the thermistor 2. This can be accomplished by engaging these components together and molding any suitable resin material over this assembly or by heating and chemically joining a substrate 10 of silicon (Si) with an upper gold electrode 22a of the thermistor 2.

In the infrared sensor so manufactured, the thermistor 2 used to measure the temperature of the cold junctions is in direct contact with the substrate 10 and thus the heat sink 11a. Thus, the thermistor 2 is always maintained at the same temperature as that of the cold junctions to provide an accurate temperature compensation. Since the thermistor 2 has a large heat capacity, it stably provides less variations of temperature due to changes of external temperature or absorption of infrared rays. In accordance with the present invention, furthermore, it is not required to miniature or form the thermistor into a film and may be any conventional bulk type thermistor chip for advantageous process.

Although the aforementioned embodiment has been described as to metal oxide, it may be formed of chalcogenide or other suitable organic material.

As will be apparent from the aforementioned embodiment, the present invention can provide an infrared sensor of very simple structure which can properly monitor the temperature of the cold junctions on the thermopile at all times. This infrared sensor can provide a non-contact type thermometer which can be manufactured more precisely and inexpensively without any affection from the ambient temperature.

Figure 4:
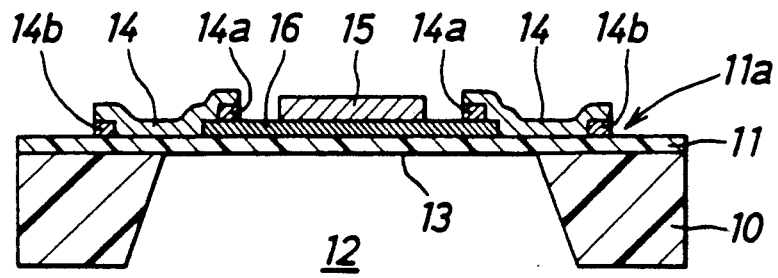
FIG. 4 is a diagrammatically cross-sectional view of another embodiment of a temperature compensation type infrared sensor constructed in accordance with the present invention.

FIG. 4 is a diagrammatically cross-sectional view of a thermopile element in the second embodiment of a temperature compensation type infrared sensor constructed in accordance with the present invention. In this figure, similar reference numerals similar to those of FIG. 1 denote similar parts.

In the second embodiment, heat transmission between the black body 15 and the hot junction 14a of each of the thermocouples 14 can be promoted by forming a hard carbon film 16 on the central portion of the diaphragm 13 and depositing ultrafine gold particles on the central portion of the diaphragm 13 to form the black body 15 for absorbing infrared rays. Around the black body 15 are disposed a thermopile which comprises a plurality of thermocouples 14 connected in series with one another. The hot junctions 14a of the thermocouples 14 are disposed on the hard carbon film 16 while the cold junctions 14b are located on the heat sink 11a formed around the periphery of the substrate 10.

The hard carbon film 16 is an amorphous carbon film formed by bonding carbon with hydrogen formed from plasma polymerization within an atmosphere of hydrocarbon gas. Generally, such a material is known as a "diamond-like carbon"(DLC) film (for example, see Lars-Peter Andersson "A REVIEW OF RECENT WORK ON HARD i-c FILMS" in 'Thin Solid Film, 86' on pages 193-200, published on 1981). This material exhibits a hardness and electrical insulation next to those of diamond and has a heat conductivity about five times that of copper.

Heat quantity in the black body 15 which absorbs infrared rays and is increased in temperature is transmitted more rapidly to the hot junctions 14b of the thermocouples 14 through the hard carbon film 16 to improve the responsibility in the infrared sensor. At the same time, any differential temperature between the hot junctions 14a will be equalized through the hard carbon film 16.

On the other hand, the heat sink 11a on which the cold junctions 14b of the thermocouples 14 are mounted is separated apart from the hard carbon film 16. Very little heat will be transmitted from the black body 15 to the heat sink 11a. Therefore, there is created very large temperature gradient between the hot and cold junctions 14a, 14b of each of the thermocouples 14 to produce a large thermoelectromotiveforce.

The important matter of the second embodiment is that the hard carbon film 16 will not overlap the heat sink 11a. If the hard carbon film 16 overlaps the heat sink 11a, heat will escape to reduce the thermoelectromotive force.

Figure 5:
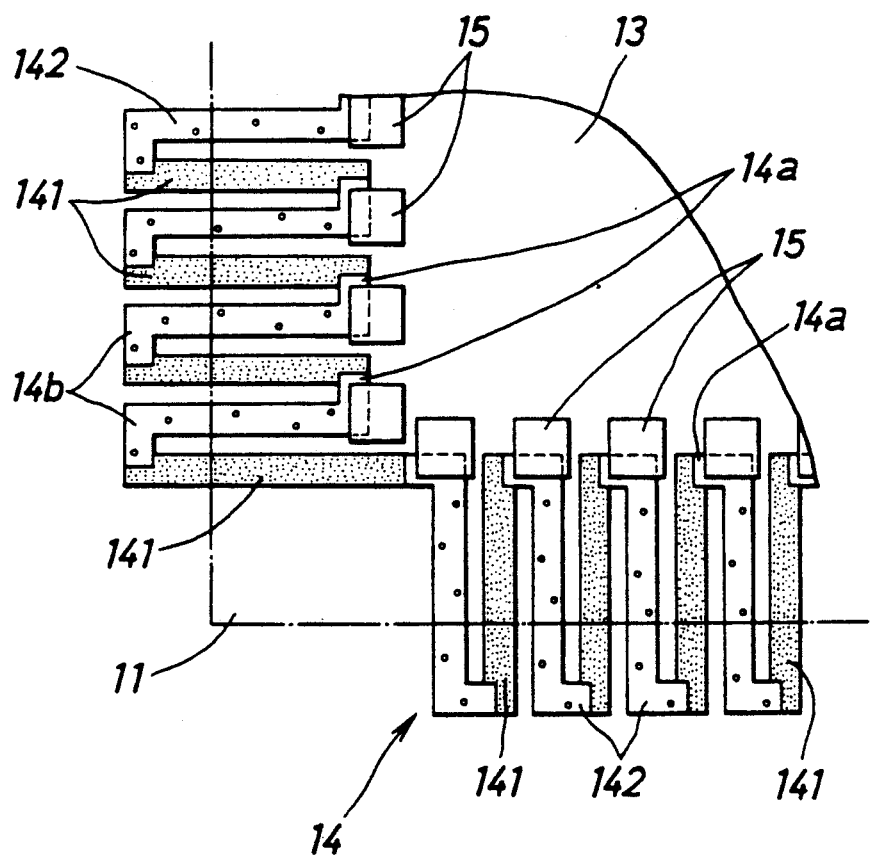
FIG. 5 is a diagrammatically plan view of a thermopile element of still another embodiment of a temperature compensation type infrared sensor constructed in accordance with the present invention.

FIG. 5 is a diagrammatic plan view of a thermopile element in the third embodiment of a temperature compensation type infrared sensor constructed in accordance with the present invention.

The third embodiment increases the rate of heat transmission between the black body and the hot junctions of the thermocouples. As in the prior art, the infrared sensor comprises a diaphragm 13 consisting of three stacked layers, an upper $SiN_x$ layer, an intermediate $SiO_2$ layer and a lower $SiN_x$ layer. First conductors 141 are patterned after a bismuth film having a thickness equal to one micron has been formed on an insulation film (not shown). Each of the patterned conductors 141 has 20 microns wide and 200 microns length. Spacing between each adjacent conductors is equal to 60 microns. Subsequently, second conductors 142 are formed by forming and patterning an antimony film as in the bismuth film. As seen from FIG. 5, this process forms a plurality of thermocouples 14 having hot and cold junctions 14a, 14b which are connected together in series. Thereafter, an electrically conductive black body pieces 15' are formed to include the corresponding one of the hot junctions 14a and to be electrically insulated from any other hot junction 14a. The electrically conductive black body pieces 15' is formed by depositing ultrafine gold particles in vacuum and forming them into a film having a thickness equal to 5 microns. The patterning is accomplished by using the resist lift-off process. It has been confirmed that such a structure increased the output voltage about 20% although the entire surface area of the electrically conductive black body pieces 15' was decreased. In order to avoid any electrical short-circuiting due to contact between the bismuth and the gold particles when the first conductors 141 are formed, the antimony layers forming the second conductors 142 may be patterned larger than the prior art at the hot junctions. As a result, the surface area of the gold particles at each hot junction can be increased.

Although each of the hot junctions 14a is in direct contact with the corresponding one of the black body pieces 15' in the third embodiment, the individual black body pieces 15' are separated apart from the others not to provide any short-circuiting in the thermopile.

Figure 6:
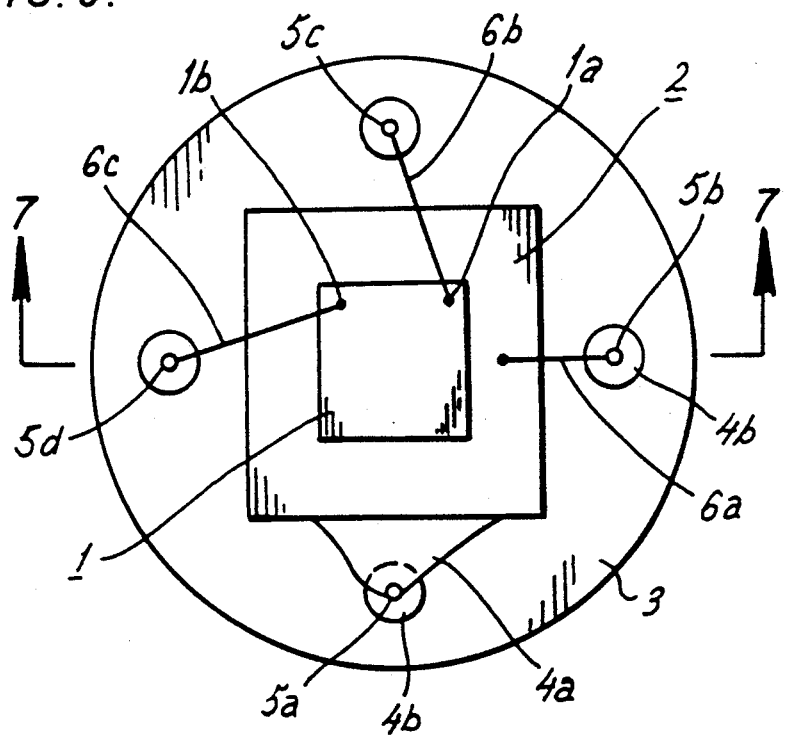
FIG. 6 is a plan view of a thermopile element in a further embodiment of a temperature compensation type infrared sensor constructed in accordance with the present invention.
Figure 7:
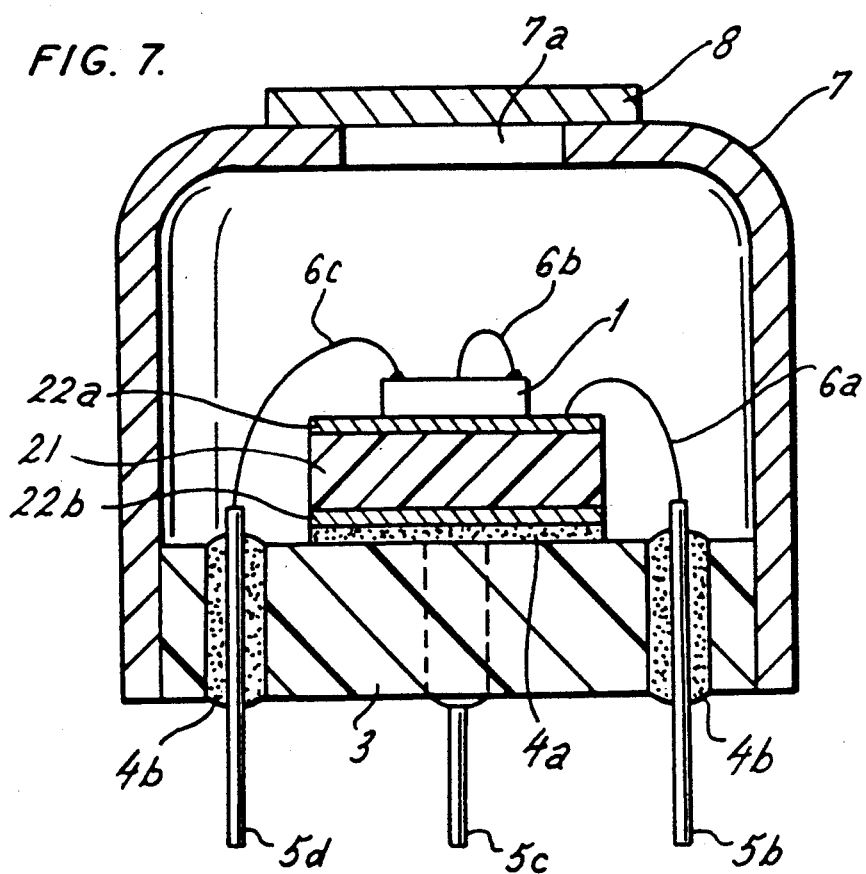
FIG. 7 is a cross-sectional view of a temperature compensation type infrared sensor on which a cap is mounted to cover the thermopile element shown in FIG. 6, taken along line B—B in FIG. 6.

FIGS. 6 and 7 show a further embodiment of a temperature compensation type infrared sensor constructed in accordance with the present invention. FIG. 6 is a plan view of a thermopile element without any cap while FIG. 7 is a cross-sectional view of the thermopile element through its center.

The infrared sensor comprises a thermistor 2 including an upper electrode 22a, a resistance chip 21 and a lower electrode 22b. The thermistor 2 is adhesively bonded on a substrate 3 through an electrically conductive adhesive 4a. The substrate 3 includes four leads 5a, 5b, 5c and 5d which are incorporated thereinto through hermetic seals 4b (air-tight sealing material such as glass). The lower electrode 22b of the thermistor 2 is connected with the lead 5a through the electrically conductive adhesive 4a while the upper electrode 22a is connected with the lead 5b through a bonding wire 6a. A diaphragm-like thermopile element 1 is disposed on and bonded to the thermistor 2 through any suitable adhesive (not shown). The thermopile element 1 further includes two terminals 1a and 1b which are connected respectively with leads 5c and 5d through bonding wires 6b and 6c. A metallic cap 7 is soldered on the substrate 3. The cap 7 has a window 7a for receiving infrared rays, the window being sealingly closed by a transparent silicon plate 8 since the silicon plate permits the infrared rays to pass therethrough. The interior of the cap 7 is evacuated and maintained in vacuum (the soldering being performed by friction welding in vacuum).

Such an infrared sensor can cause heat to transmit to the hot junctions without energy loss from the black body pieces to the ambient gas as in the prior art. As a result, a large thermoelectromotive force will be produced in the leads 5a, 5b, 5c and 5d. The relationship between the degree of vacuum in the cap and the resulting sensitivity are shown in the following table, in comparison with the prior art wherein gas is charged into the cap.

| Structure | Gas Charge | Decompression Sealing | | | | | |
|---|---|---|---|---|---|---|---|
| Internal Pressure (Torr) | 760 | 10 | 1 | 0.1 | $10^{-2}$ | $10^{-3}$ | $10^{-4}$ |
| Ratio of Detection Sensitivity | 1.0 | 1.2 | 1.7 | 3.2 | 3.8 | 4.0 | 4.0 |

As will be apparent from the above table, the decompression sealing can provide the detection sensitivity about four times those of the prior art to improve the infrared sensor greatly in performance.

Although the present embodiment utilizes the solid-phase boding technique as means for attaining the decompressed structure, the present invention is not limited to such a technique and may be accomplished by using any other suitable means such as spot welding or the like.

Although the thermopile element has been described as an example of the non-contact type infrared detector elements, the present invention is not limited to the thermopile element and may be applied to any other suitable thermometer such as thermistor, current collector or the like.

Since energy can be effectively transmitted from the black body to the hot junctions in accordance with the present embodiment, the infrared sensor can be highly improved with respect to the detection sensitivity in comparison with the prior art. Although the present invention has been described as to several preferred embodiments, it is not limited to the the exemplified thermopile type infrared sensors and may be applied similarly to any other suitable infrared sensors such as thermistor type, current collector type and other types.

What we claim is:

1. A temperature compensation type infrared sensor comprising a thermopile element including a substrate having a central pit and functioning also as a heat sink; an insulation film formed on the top face of said substrate and defining a diaphragm located above said pit; a plurality of thermocouples disposed on said insulation film and connected in series together, each of said thermocouples having a hot junction on said diaphragm and a cold junction on said heat sink; and a black body means on the central portion of said diaphragm in said insulation film and which serves to absorb infrared rays, said thermopile element being placed on a thermistor chip means for compensating for temperature.

2. A temperature compensation type infrared sensor as defined in claim 1, further including a cap for decompression sealing between said thermopile element and said thermistor chip means, said cap including a window for permitting infrared rays to pass therethrough.

3. A temperature compensation type infrared sensor as defined in claim 1 wherein said black body means in said thermopile element is spaced away from the hot junction of each of said thermocouples through a small spacing.

4. A temperature compensation type infrared sensor as defined in claim 3 wherein said black body means is connected with the hot junction of each of said thermocouples through a hard carbon film.

5. A temperature compensation type infrared sensor as defined in claim 1 wherein said black body means is divided into a plurality of black body pieces, each of said black body pieces being in direct contact with the hot junction in the corresponding one of the thermocouples.

6. A temperature compensation type infrared sensor as defined in claim 1 wherein each of said thermocouples comprises two different metals joined together, one of said metals including an enlarged connection portion which is in contact with the black body means.

7. In a thermal element type infrared sensor having a plurality of thermocouple elements, each of said thermocouple elements having a cold junction, each of said cold junctions being disposed on an upper layer of a heat sink, the improvement comprising means mounted to the bottom of said heat sink for sensing the temperature thereof and of said cold junction, said cold junction temperature sensing means comprising a thermistor chip means.

8. The device of claim 7 further comprising means for enclosing said infrared sensor, the pressure inside said enclosing means being reduced below atmospheric pressure, and a window in said enclosing means for infrared rays to pass therethrough.

9. The device of claim 7 further comprising a plurality of black body means for absorbing infrared rays and thereby elevating in temperature, each of said thermocouple elements having a hot junction, and wherein a black body means is associated with each of said hot junctions.

10. The device of claim 9 wherein each of said black body means is in direct thermal contact with its associated hot junction.

11. The device of claim 7 wherein each of said thermocouple elements has a hot junction, and further comprising a black body means for absorbing infrared rays and thereby elevating in temperature, and means for thermally connecting said black body means and said plurality of hot junctions to thereby improve said black body means thermal response and consistency.

12. The device of claim 11 wherein said thermal connection means comprises a hard carbon film.

13. A thermal element type infrared sensor including a thermopile, said thermopile having an insulating diaphragm mounted to a substrate, said substrate being generally arranged around the periphery of the diaphragm and having sufficient thermal capacity to effectively function as a heat sink, a black body means mounted to a central area of the diaphragm, said black body means having means for absorbing infrared rays and elevating in temperature in response thereto, and a plurality of thermocouple elements arranged generally circumferentially about the black body means, each of said thermocouple elements having a hot junction disposed nearer the black body means and a cold junction disposed generally above the substrate so that heat generated by said black body means has a tendency to elevate the temperature of the plurality of hot junctions, said thermopile element being mounted to a thermistor chip means so that the substrate is in thermal contact with the thermistor chip means to thereby provide an indication of the temperature of the plurality of cold junctions.

14. The device of claim 13 further comprising a hard carbon film thermally connected between the black body means and each of the hot junctions to thereby improve the thermal response and consistency of response between said hot junctions as said black body means elevates in temperature.

15. The device of claim 13 wherein said black body means is comprised of a plurality of black body elements, each of said black body elements being in direct thermal contact with each of said hot junctions.

16. The device of claim 13 further comprising a cap for enclosing the thermopile and thermistor chip means in a pressurized condition, the interior of said cap having its pressure reduced below atmospheric pressure in order to enhance temperature sensitivity and response.

* * * * *